United States Patent
Akiyoshi (10) Patent No.: US 10,922,108 B2
(45) Date of Patent: Feb. 16, 2021

(54) INFORMATION PROCESSING APPARATUS, METHOD FOR PROCESSING INFORMATION, AND INFORMATION PROCESSING PROGRAM

(71) Applicant: Kunihiro Akiyoshi, Fukuoka (JP)

(72) Inventor: Kunihiro Akiyoshi, Fukuoka (JP)

(73) Assignee: Ricoh Company, Ltd., Tokyo (JP)

( * ) Notice: Subject to any disclaimer, the term of this patent is extended or adjusted under 35 U.S.C. 154(b) by 399 days.

(21) Appl. No.: 15/677,134

(22) Filed: Aug. 15, 2017

(65) Prior Publication Data

US 2018/0052697 A1 Feb. 22, 2018

(30) Foreign Application Priority Data

Aug. 19, 2016 (JP) ................................ 2016-161141

(51) Int. Cl.
| | |
|---|---|
| *G06F 9/455* | (2018.01) |
| *G06F 8/61* | (2018.01) |
| *G06F 9/445* | (2018.01) |
| *G09G 5/00* | (2006.01) |
| *G06F 30/331* | (2020.01) |
| *B41J 29/42* | (2006.01) |

(Continued)

(52) U.S. Cl.
CPC .......... *G06F 9/45508* (2013.01); *B41J 29/42* (2013.01); *G06F 3/0481* (2013.01); *G06F 8/61* (2013.01); *G06F 8/62* (2013.01); *G06F 9/445* (2013.01); *G06F 30/331* (2020.01); *G09G 5/001* (2013.01); *G06F 3/1454* (2013.01); *G09G 2330/027* (2013.01); *G09G 2340/14* (2013.01); *G09G 2354/00* (2013.01); *G09G 2360/121* (2013.01); *H04N 2201/0094* (2013.01)

(58) Field of Classification Search
None
See application file for complete search history.

(56) References Cited

U.S. PATENT DOCUMENTS 6,560,776 B1 * 5/2003 Breggin .................... G06F 8/61
707/999.202
7,554,685 B2 6/2009 Akiyoshi et al.
(Continued)

FOREIGN PATENT DOCUMENTS

| JP | 2006-079534 | 3/2006 |
|---|---|---|
| JP | 2006-196980 | 7/2006 |

(Continued)

OTHER PUBLICATIONS

U.S. Appl. No. 15/449,059, filed Mar. 3, 2017.
Japanese Office Action for 2016-161141 dated Jul. 14, 2020.
Japanese Office Action for 2016-161141 dated Oct. 20, 2020.

*Primary Examiner* — Cedric Johnson
(74) *Attorney, Agent, or Firm* — IPUSA, PLLC (57) ABSTRACT

An information processing apparatus includes an installation control unit configured to execute an installation of a program, validate predetermined information for the program and thereafter execute the program, and invalidate the predetermined information when the program is successfully executed, and a launching control unit configured to launch the program installed in the information processing apparatus when the information processing apparatus is started up, the launching control unit not launching the program, for which the predetermined information is validated.

18 Claims, 8 Drawing Sheets

| APP ID | APP NAME | AUTOMATIC LAUNCH SETUP | PROVISIONAL INSTALLATION FLAG | ... |
|---|---|---|---|---|
| 001 | AAA | True | False | ... |
| 002 | BBB | True | False | ... |
| 003 | CCC | True | True | ... |
| | | | | |

130

(51) Int. Cl.
*G06F 3/0481* (2013.01)
*G06F 3/14* (2006.01)

(56) References Cited

U.S. PATENT DOCUMENTS

| | | | |
|---|---|---|---|
| 7,624,394 B1 * | 11/2009 | Christopher, Jr. | G06F 8/61 |
| | | | 717/174 |
| 7,636,172 B2 | 12/2009 | Akiyoshi et al. | |
| 7,812,978 B2 | 10/2010 | Ando et al. | |
| 8,082,449 B2 | 12/2011 | Shimizu et al. | |
| 8,209,547 B2 | 6/2012 | Shimizu et al. | |
| 8,305,591 B2 | 11/2012 | Akiyoshi et al. | |
| 8,448,193 B2 | 5/2013 | Akiyoshi | |
| 8,522,229 B2 | 8/2013 | Ando et al. | |
| 8,605,298 B2 | 12/2013 | Ando et al. | |
| 8,665,466 B2 | 3/2014 | Akiyoshi | |
| 8,752,041 B2 | 6/2014 | Akiyoshi et al. | |
| 8,775,785 B2 | 7/2014 | Akiyoshi | |
| 8,819,665 B2 | 8/2014 | Ando et al. | |
| 9,019,516 B2 | 4/2015 | Akiyoshi et al. | |
| 9,098,306 B2 | 8/2015 | Akiyoshi | |
| 9,164,865 B2 | 10/2015 | Ando et al. | |
| 9,167,113 B2 | 10/2015 | Akiyoshi et al. | |
| 9,645,863 B2 | 5/2017 | Akiyoshi | |
| 2012/0210110 A1 * | 8/2012 | Akiyoshi | G06F 9/4401 |
| | | | 713/1 |
| 2014/0075244 A1 | 3/2014 | Takahashi | |
| 2015/0081266 A1 | 3/2015 | Takahashi et al. | |
| 2015/0081268 A1 | 3/2015 | Ohhashi et al. | |
| 2016/0065756 A1 | 3/2016 | Araki et al. | |

FOREIGN PATENT DOCUMENTS

| | | | |
|---|---|---|---|
| JP | 2008-084304 | 4/2008 | |
| JP | 2012-185800 | 9/2012 | |
| JP | 2012185800 A * | 9/2012 | G06F 9/4401 |
| JP | 2012-213904 | 11/2012 | |
| JP | 2014-135608 | 7/2014 | |
| JP | 2016-66303 | 4/2016 | |
| JP | 2014-052867 | 7/2020 | |

* cited by examiner

| APP ID | APP NAME | AUTOMATIC LAUNCH SETUP | PROVISIONAL INSTALLATION FLAG | ... |
|---|---|---|---|---|
| 001 | AAA | True | False | ... |
| 002 | BBB | True | False | ... |
| 003 | CCC | True | True | ... |
|  |  |  |  |  |

INFORMATION PROCESSING APPARATUS, METHOD FOR PROCESSING INFORMATION, AND INFORMATION PROCESSING PROGRAM

CROSS-REFERENCE TO RELATED APPLICATIONS

The present application claims priority under 35 U.S.C. § 119 to Japanese Patent Application No. 2016-161141, filed Aug. 19, 2016. The contents of which are incorporated herein by reference in their entirety.

BACKGROUND OF THE INVENTION

Field of the Invention

The present invention relates to an information processing apparatus, a method for processing information, and an information processing program.

Description of the Related Art

An image forming apparatus or the like includes a platform (hereinafter, an application platform) for executing an application (app) program and installs the application program suitable for a use environment of a user as a plug-in so as to enhance a function. Hereinafter, this application program is referred to as a "plug-in app".

This plug-in app is ordinarily launched by an application platform during a start-up process (turning on the main power source) of the image forming apparatus. Unlike a personal computer (PC), various functions of an image forming apparatus are required to be immediately used. It is considered to be cumbersome for the user to be required to do a launching operation of a plug-in app every use of the function.

SUMMARY OF THE INVENTION

An information processing apparatus including an installation control unit configured to execute an installation of a program, validate predetermined information for the program and thereafter execute the program, and invalidate the predetermined information when the program is successfully executed, and a launching control unit configured to launch the program installed in the information processing apparatus when the information processing apparatus is started up, the launching control unit not launching the program, for which the predetermined information is validated.

DESCRIPTION OF THE EMBODIMENTS

The capacity of a memory installed in an apparatus exemplified by an image forming apparatus is relatively smaller than the capacity of a memory installed in a personal computer (PC) from the viewpoint of reducing the memory. Further, swap of memory is ordinarily restricted to ensure the capability of a plug-in app or the like. As a result, the image forming apparatus is in a state where the capacity of the memory becomes insufficient.

Therefore, in a case where a plug-in app is newly installed in an apparatus, which has been normally operated before the installation, and the apparatus is rebooted, the capacity of the memory is probably small enough to fail launch of an application platform during launching processes of multiple plug-in apps. Because the application platform is not launched in the apparatus, the plug-in app neither can be used nor can be uninstalled. This is because the uninstallation function of uninstalling the plug-in app is substantialized in the application platform. If the apparatus is restarted in order to solve such a state, a phenomenon similar to the above highly probably occurs so as to fall in a situation where the application platform is kept to be not launched.

The present invention is provided in consideration of the above.

Figure 1:
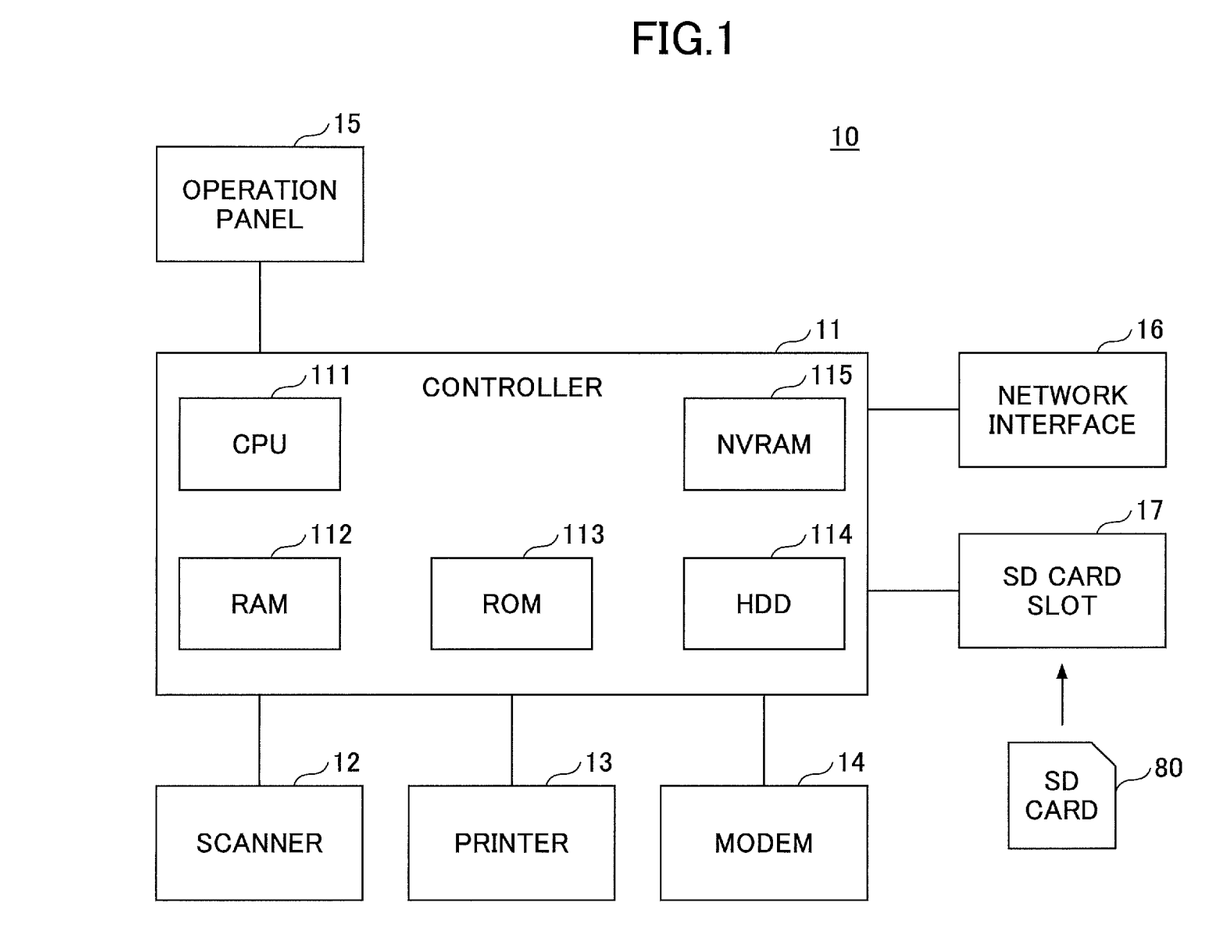
FIG. 1 illustrates an example of a hardware structure of an image forming apparatus of a first embodiment of the present invention.

Hereinafter, an embodiment of the present invention is described based on figures. FIG. 1 illustrates an example of a hardware structure of the image forming apparatus of the first embodiment. Referring to FIG. 1, the image forming apparatus 10 includes hardware such as a controller 11, a scanner 12, a printer 13, a modem 14, an operation panel 15, a network interface 16, and an SD card slot 17.

The controller 11 includes a central processing unit (CPU) 111, a random access memory (RAM) 112, a read-only memory (ROM) 113, a hard disk drive (HDD) 114, a non-volatile random access memory (NVRAM) 115, and so on. Various programs and data used by the programs are stored in the ROM 113. The RAM 112 is used as a memory area for loading the programs, a work area for the loaded programs, or the like. The CPU 111 implements various functions by processing the program loaded into the RAM 112. The HDD 114 stores the programs, various data used by the programs, or the like. The NVRAM 115 stores various kinds of setup information or the like.

The scanner 12 is hardware (an image reading unit) for reading image data from an original manuscript. The printer 13 is hardware (a printing unit) for printing print data on a print paper. The modem 14 is hardware for connecting the image forming apparatus 10 to a telecommunication line and is used for sending and receiving the image data with fax communications. The operation panel 15 is hardware provided with an input unit for receiving an input from a user such as a button, a display unit such as a liquid crystal panel, or the like. The liquid crystal panel may have a function of a touch panel. In this case, the liquid crystal panel may also have a function of an input unit. The network interface 16 is hardware for connecting the image forming apparatus 10 to a wired or wireless network such as LAN. The SD card slot 17 is used to read a program stored in an SD card 80. Said differently, not only the program stored in the ROM 113 but also the program stored in the SD card 80 may be loaded into the RAM 112 and executed by the image forming apparatus 10. The SD card 80 may be replaced by another recording medium such as a CD-ROM and a universal serial bus (USB) memory. The type of the recording medium substituting for the SD card 80 is not specifically limited. In this case, the SD card slot 17 may be replaced by hardware depending on kinds of the recording medium.

Figure 2:
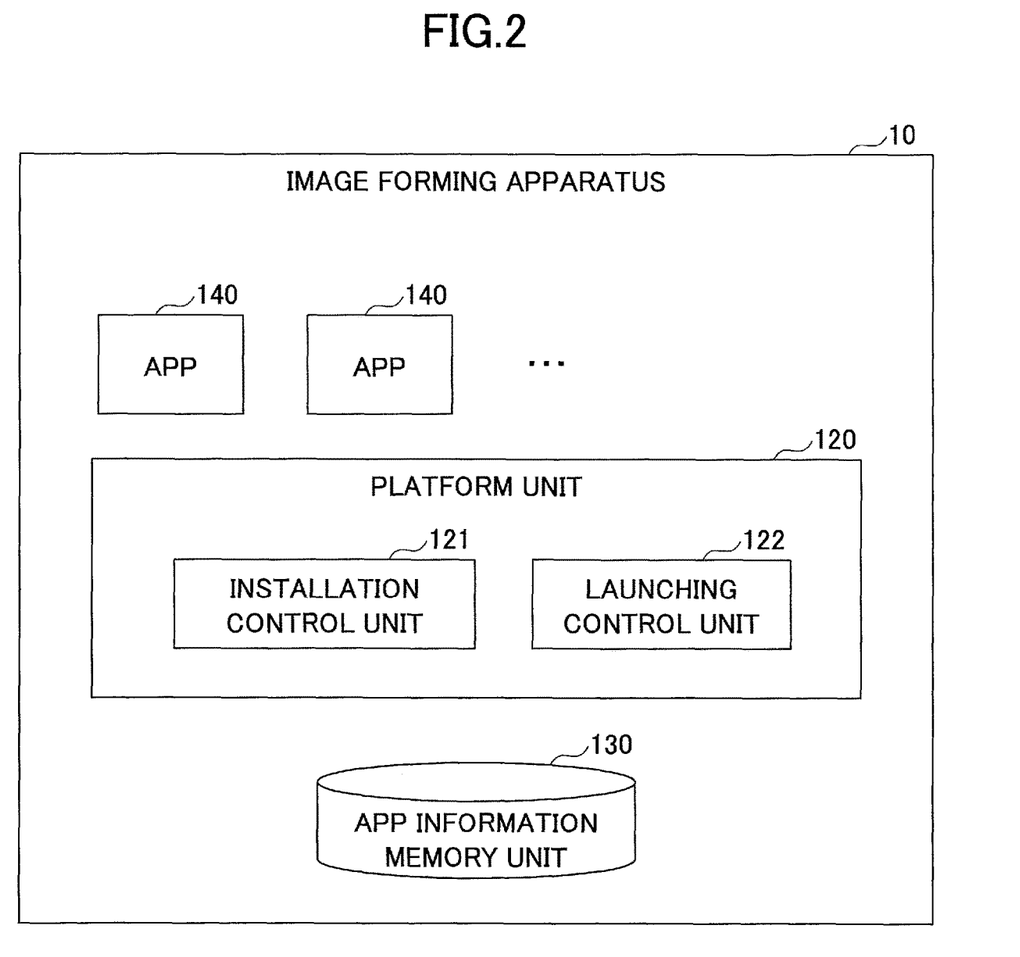
FIG. 2 illustrates an example of a functional structure of the image forming apparatus of the first embodiment.

FIG. 2 illustrates an example of a functional structure of the image forming apparatus of the first embodiment. Referring to FIG. 2, the image forming apparatus 10 includes a platform unit 120. The platform unit 120 is implemented when at least one program installed in the image forming apparatus 10 is executed by the CPU 111. The image forming apparatus 10 includes and uses an app information memory unit 130. The app information memory unit 130 is implemented by using, for example, the HDD 114, or a memory device connectable to the image forming apparatus 10 through the network.

The platform unit 120 functions as a platform of the app 140 installed into the image forming apparatus 10. For example, the platform unit 120 provides an application program interface (API) for controlling the hardware of the image forming apparatus 10 to the app 140, and controls the hardware of the image forming apparatus 10 in response to a call of the API from the app 140. The platform unit 120 administers a life cycle of the app 140. For example, the platform unit 120 performs an installation, an uninstallation, a launch, a stop, and so on of the app 140.

Referring to FIG. 2, the platform unit 120 includes an installation control unit 121 and a launching control unit 122.

The installation control unit 121 controls the installation of the app 140. The installation control unit 121 stores information related to the installed app 140 in the app information memory unit 130.

The launching control unit 122 launches various apps 140 installed in the image forming apparatuses 10 by referring to the app information memory unit 130 at a time of starting up the image forming apparatus 10. Said differently, basically, the various apps 140 are automatically launched at a time of starting up the image forming apparatus 10. However, the setup of an automatic launch or a manual launch is possible for each app 140. The app 140 set to the manual launch is excluded from a launching target at a time of starting up the image forming apparatus 10, and may be launched in response to an operation instruction instructed by the user after starting up the image forming apparatus 10.

The app 140 represents an application program causing the image forming apparatus 10 to execute a predetermined process. Within the embodiment, the function of the app 140 is not specifically limited.

Figure 3:
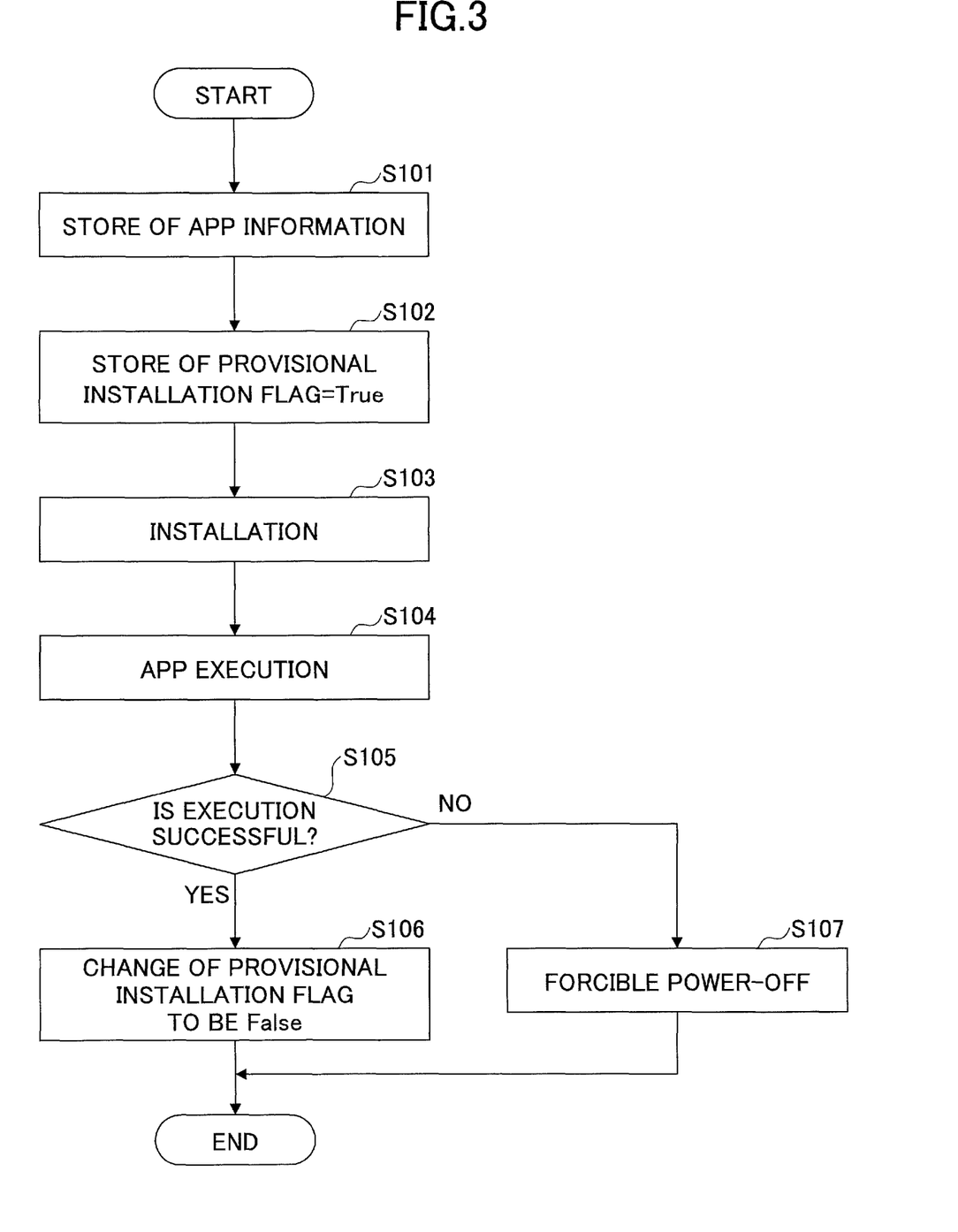
FIG. 3 is a flowchart for explaining an example of a procedure of a process of installing an app.

Hereinafter, the procedure of processes performed by the image forming apparatus 10 is described. FIG. 3 is a flowchart for explaining an example of the procedure of a process of installing the app.

When the installation of the app 140 (hereinafter, referred to as a "target app 140") is instructed during the start-up state of the image forming apparatus, the process illustrated in FIG. 3 is started. An installation package of the target app 140 of an installation source may be stored in, for example, the SD card 80 or downloaded through the network. The installation package is data including a program body of the target app 140, attribute information (hereinafter, "app information") of the target app 140, and so on. The installation package may be stored in, for example, a file.

In step S101, the installation control unit 121 stores app information included in an installation package of the target app 140 into the app information memory unit 130.

Figure 4:
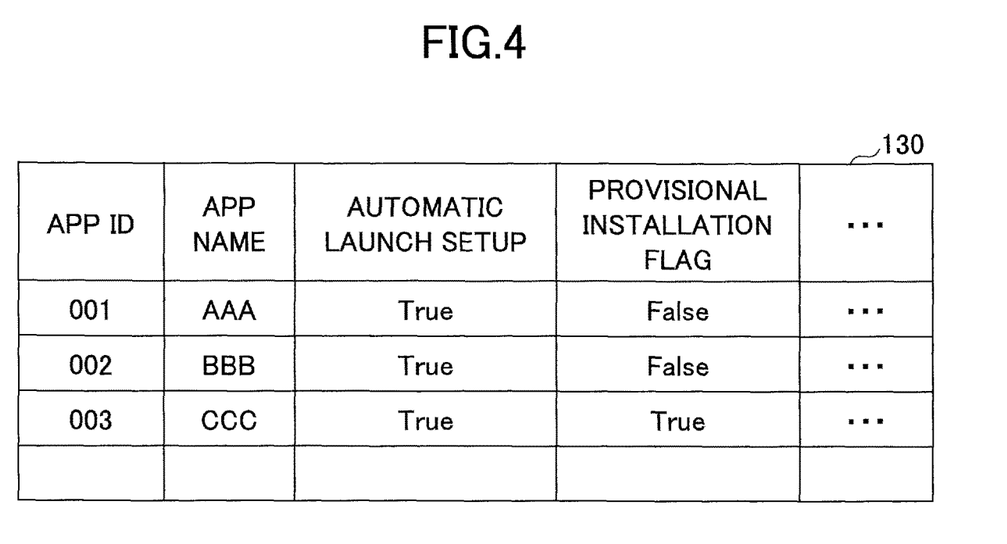
FIG. 4 illustrates an example of a structure of an app information memory unit.

FIG. 4 illustrates an example of the structure of the app information memory unit. Referring to FIG. 4, the app information memory unit 130 stores values of items such as an app ID, an app name, an automatic launch setup, and a provisional installation flag for each app 140 installed in the image forming apparatus 10.

The app ID is identification information for each app 140 and used by the platform unit 120 to identify the apps 140. The app name is the name of the app 140 and used as, for example, a character string for display. The automatic launch setup is information indicative of whether the app is a target of an automatic launch at a time of starting up the image forming apparatus 10 (during the start-up process). The value is "True" or "False". The "True" indicates the app is subjected to the automatic launch, and the "False" indicates the app is subjected to the manual launch.

The provisional installation flag is information indicating whether an installation state of the app 140 is a provisional installation state or not. The value of the information is "True" or "False". A provisional installation state is represented by "True". A formal installation state where the installation is formally done and is not the provisional installation state is represented by "False". The provisional installation state is a state where a normal execution of the app 140 is not checked after installing the app 140.

In step S101, a new record is made for the app information memory unit 130. An app ID, an app name, and an automatic launch setup of the target app 140 are stored for in the new recode. The value of the automatic launch setup may be "True" as the preset value, may be set inside an installation, or may be selected by a user.

In step S102, the installation control unit 121 stores "True" in the information memory unit 130 as a value of a provisional installation flag of the target app 140 (step S102). Said differently, a provisional installation flag of a target app 140 is validated so that the target app 140 becomes in a provisional installation state.

Subsequently, the installation control unit 121 executes an installation of the target app 140 (step S103). The target app 140 is installed in the image forming apparatus 10 so as to be identified based on the app ID of the target app 140. Subsequently, the installation control unit 121 executes the target app 140 (S104).

Here, the execution of the target app 140 may be a launch of the target app 140 or an execution of a basic function of the launched target app 140.

In a case where the target app 140 are successfully executed (YES in S105), the installation control unit 121 changes (invalidates) the provisional installation flag stored in the app information memory unit 130 in connection with the target app 140 to be "False" (S106).

In a case where the target app 140 was successfully executed, the installation control unit 121 may collate to the user whether the target app 140 is determined to be in the formal install state. For example, the installation control unit 121 may display a screen for inquiring whether the target app 140 is made to be in the formal installation state on the operation panel 15. In a case where the user inputs an input indicative of a permission to make the target app 140 to be in the formal installation state, the installation control unit 121 executes step S106. Otherwise, the installation control unit 121 may not execute step S106.

On the other hand, in a case where the execution of the app 140 fails to cause the operation of the image forming apparatus 10 to be unstable (NO in S105), the user forcibly cuts off the power supply of the image forming apparatus 10 (S107). As a result, the operation of the image forming apparatus 10 is stopped while the provisional installation flag of the target app 140 remains to be "False".

Figure 5:
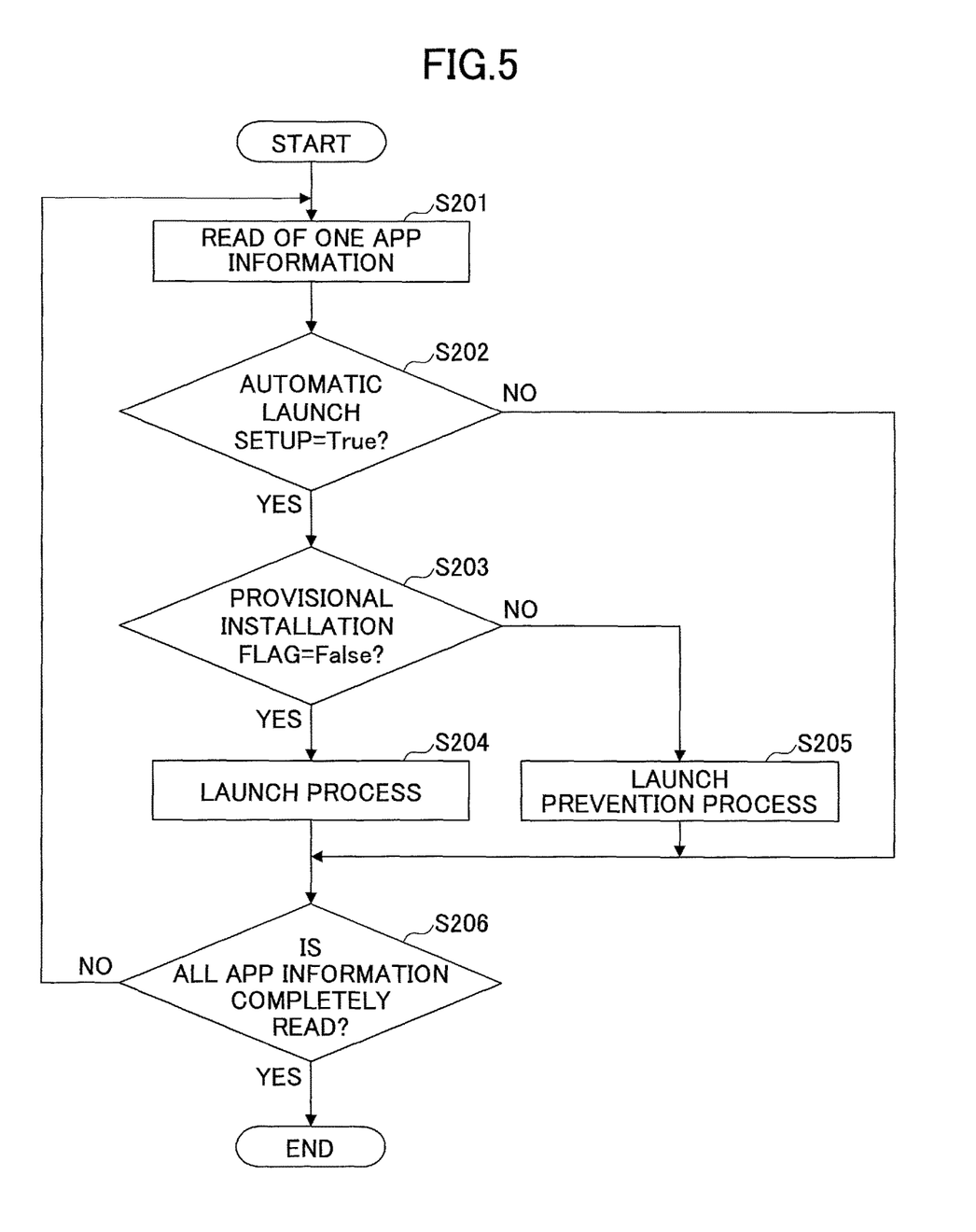
FIG. 5 is a flowchart illustrating an example of a procedure of a start-up process of the image forming apparatus.

Described next is a process of starting up the image forming apparatus 10. FIG. 5 is a flowchart illustrating an example of a procedure of a start-up process of the image forming apparatus. The procedure illustrated in FIG. 5 is executed after the platform unit 120 is started up in the start-up process of the image forming apparatus 10.

In step S201, the launching control unit 122 reads one record (app information) from the app information memory unit 130. Hereinafter, the read record is referred to as "target app information".

Subsequently, the launching control unit 122 determines whether the value of the automatic launch setup of the target app information is "True" (S202). When the value of the automatic launch setup of the target app information is "False" (NO in S202), the app 140 related the target app information is not launched and the process goes to step S206. In a case where the value of the automatic launch setup of the target app information is "True" (YES in S202), the launching control unit 122 determines whether the value of the provisional installation flag of the target app information is "False" (S203). In a case where the value of the provisional installation flag of the target app information is "False" (YES of S203), the launching control unit 122 launches the app 140 (hereinafter, referred to as a "target app 140") related to the app ID of the target app information (S204).

On the other hand, in a case where the value of the provisional installation flag of the provisional installation flag is "True" (NO of S203), the launching control unit 122 prevents the target app 140 from launching (S205). Said differently, the launching control unit 122 launches the target app 140. In a case where the target app 140 is included in a launching target, there is a possibility that an operation of the image forming apparatus 10 is not stabilized. The launching control unit 122 may forcibly (automatically) execute uninstallation of the target app 140 in a case where the value of the provisional installation flag is "True". In a case where the target app 140 is uninstalled, the app information of the target app 140 is removed from the app information memory unit 130. The launching control unit 122 may output an inquiry related to the target app 140. Said differently, it may be allowed to collate how the user handles the target app 140. For example, the launching control unit 122 may display a screen for inquiring whether the target app 140 is uninstalled or the target app 140 is manually launched. The launching control unit 122 may execute a process in conformity with a method of handling selected by the user.

After performing steps S201 to S205 for all records stored in the app information memory unit 130 (YES of S206), the process illustrated in step S206 ends.

As described above, within the first embodiment, the provisional installation flag is validated for the app 140 before the app 140 is executed (launched) at a time of installing the app 140. Therefore, in a case where the operation of the image forming apparatus 10 is not normal because of the execution of the app 140, the power supply of the image forming apparatus 10 is turned off while the provisional installation flag is valid. In a case where the image forming apparatus 10 is restarted, the app 140, of which provisional installation flag is effective, is excluded from a launching target. Therefore, it is possible to solve a state where the program (the app 140) is not launched.

Said differently, because the provisional installation flag is validated before the resource is consumed at a time of installing the app 140, the probability that the system of the image forming apparatus 10 becomes unstable is low. Therefore, the probability that the provisional installation flag is validated is high. Accordingly, in a case where the system becomes unstable at a time of launching the app 140 and therefore the system is restarted, the probability of specifying the app 140 being in the provisional install state can be enhanced. As a result, it is possible to arbitrarily control the app provisionally installed before launching the app 140. Thus, it is possible to prevent the entire system from being unstable due to an unconditional launch of the app 140.

Further, in a system having few resource, a system failure can be avoidable by a highly certain method using a program logic without using an uncertain method of an operational limitation. Therefore, the installation of the app 140 can be safely and easily installed and an limitation related to the installation of the app 140 can be relaxed. Further, with this, a function of a trial installation can be safely provided such that a use of the app 140 is permitted only a predetermined period. Therefore, a business opportunity can be expanded.

Further, the validation and the invalidation of the provisional installation flag may be implemented by a method other than setting the value of the provisional installation flag to "True" or "False". For example, the information indicative of the provisional installation state is added to the app information to validate the provisional installation flag, and the information indicative of the provisional install state is deleted from the app information to invalidate the provisional install flag. Alternatively, information (e.g., an extension) indicative of the provisional installation state may be added to information related to the app 140 such as an app ID, an app name, and a file name of the app 140 to cause the provisional installation flag to be validated. The information indicative of the provisional installation state may be deleted from the information related to the app 140 to cause the provisional installation flag to be invalidated.

Next, a second embodiment is described. Differences of the second embodiment from the first embodiment are described below. Features of the second embodiment, which are not Specifically described, are substantially the same as those of the first embodiment.

Figure 6:
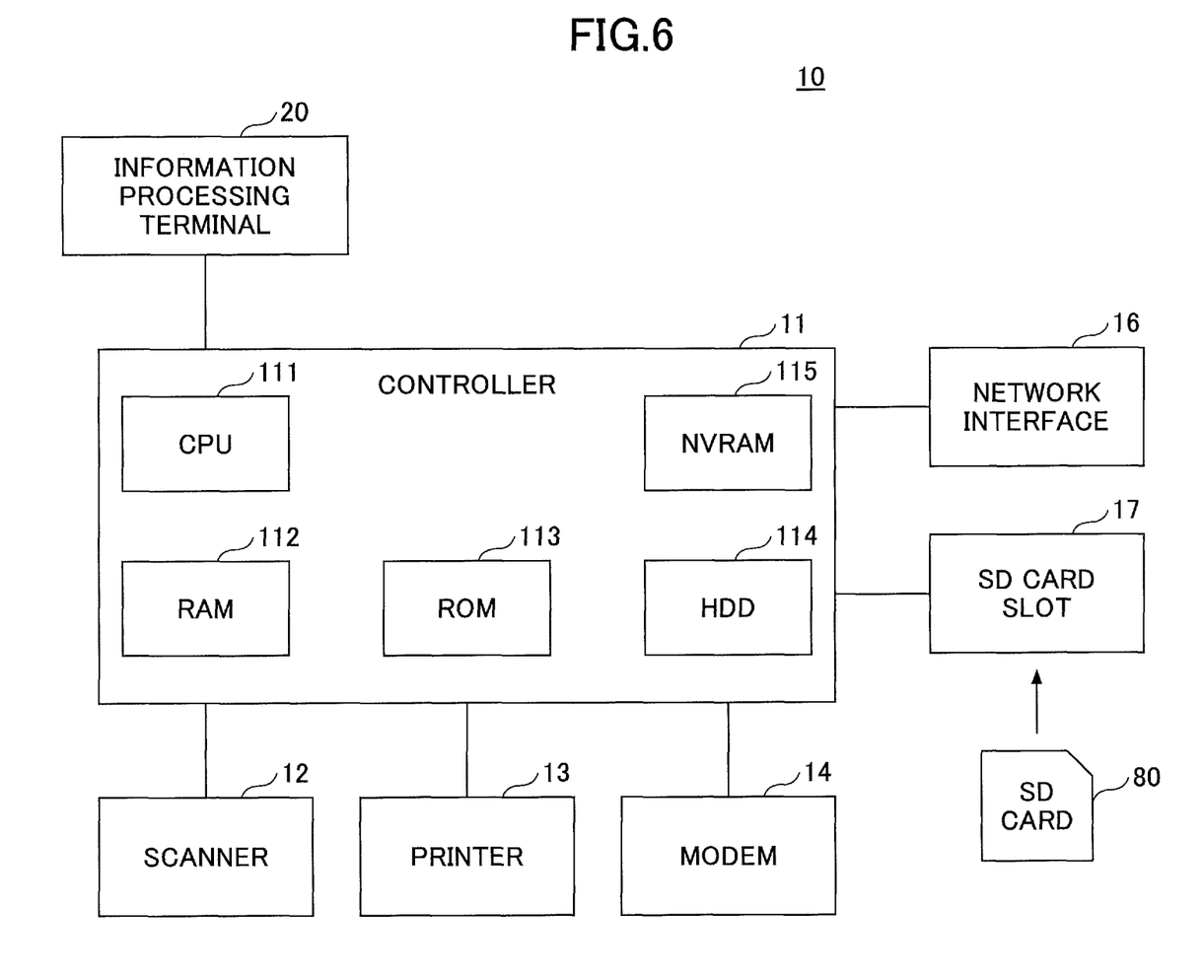
FIG. 6 illustrates an example of the hardware structure of the image forming apparatus of a second embodiment of the present invention.

FIG. 6 illustrates an example of a hardware structure of the image forming apparatus of the second embodiment. Referring to FIG. 6, the same reference symbols as those in FIG. 1 are given to the same portions, and explanation of these portions is omitted.

Referring to FIG. 6, the information processing terminal 20 is connected to the controller 11 instead of the operation panel 15. The information processing terminal 20 is an apparatus which individually processes information such as a smartphone and a tablet-type terminal. Within the second embodiment, the information processing terminal 20 functions as an operation unit of the image forming apparatus 10. The controller 11 and the information processing terminal 20 may be connected through a communication line such as a universal serial bus (USB) cable, near field communications, or a local area network (LAN).

Figure 7:
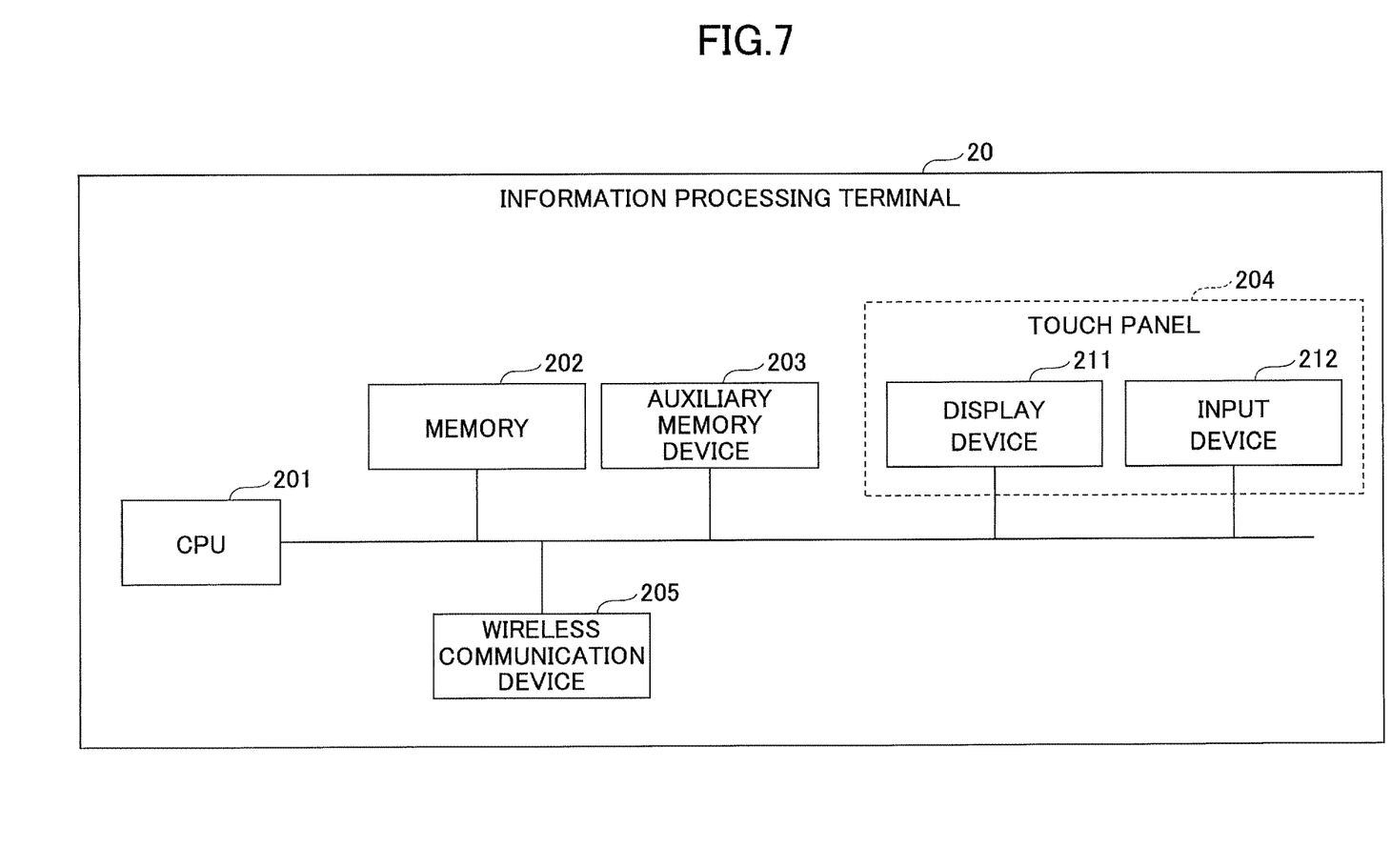
FIG. 7 illustrates an example of the hardware structure of the information processing terminal of the second embodiment.

FIG. 7 illustrates an example of a hardware structure of the information processing terminal of the second embodiment. Referring to FIG. 7, the information processing terminal 20 includes a CPU 201, a memory 202, an auxiliary memory device 203, a touch panel 204, and a wireless communication device 205.

The auxiliary memory device 203 stores a program or the like installed in the information processing terminal 20. The memory 202 reads out the program from the auxiliary memory device 203 when the program is instructed to be launched and stores the program in the memory 202. The CPU 201 implements a function related to the information processing terminal 20 in conformity with the program stored in the memory 202.

The touch panel 204 is an electronic component having both an input function and a display function to display information or receive an input from the user. The touch panel 204 includes a display device 211, an input device 212, and so on.

The display device 211 is a liquid crystal display or the like and performs a display function of the touch panel 204. The input device 212 is an electronic component including a sensor for detecting a touch of a touching object on the display device 211. A detection method of the touching object may be any one of known methods such as an electrostatic method, a resistance film method, and an optical method. The touching object is an object touching a contact surface (a front surface) of the touch panel 204. As an example of the touching object is a finger of the user, a dedicated pen, an ordinary pen, or the like.

The wireless communication device 205 is an electronic component such as an antenna for communications in a wireless local area network (LAN) or a mobile communication network. However, within the second embodiment, the information processing terminal 20 may not include the wireless communication device 205.

Within the second embodiment, the information processing terminal 20 has a functional structure illustrated in FIG. 6. Said differently, the app 140 can be installed into the information processing terminal 20.

The information processing terminal 20 executes the procedure illustrated in FIGS. 3 and 5. As a result, it is possible to prevent a state where the launching process of the app 140 in the information processing terminal 20 is misbehaving.

In this case, the app information memory unit 130 may be implemented using the auxiliary memory device 203.

Further, the power-off in step S107 illustrated in FIG. 3 may be limitedly applied to the information processing terminal 20 or may be applied to the entire image forming apparatus 10 including the information processing terminal 20.

Within the above embodiments, the app 140 may be delivered to the image forming apparatus 10 or the information processing terminal 20 through a network such as the Internet.

Figure 8:
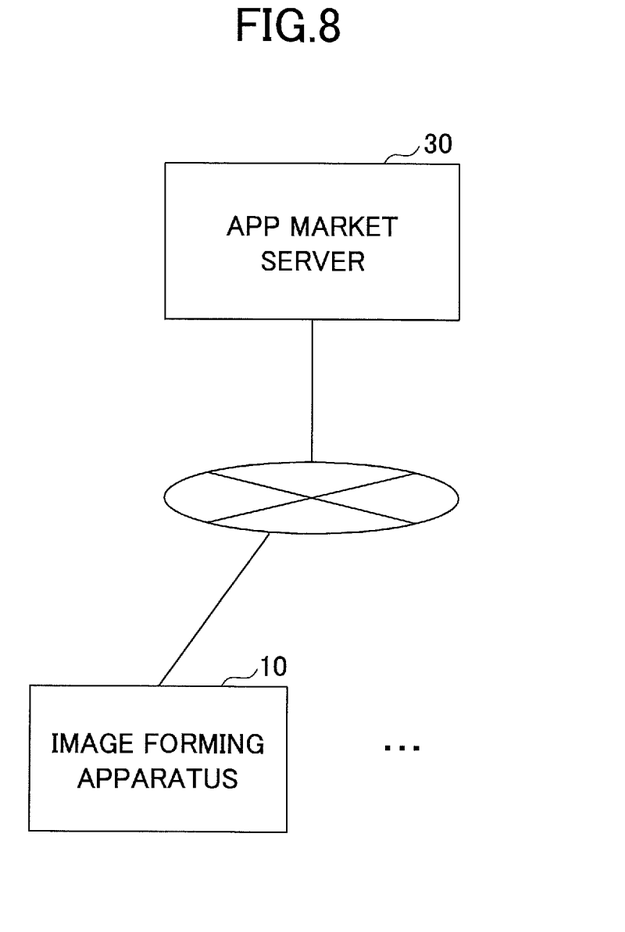
FIG. 8 illustrates an example of an app delivery system.

FIG. 8 illustrates an example of an app delivery system. Referring to FIG. 8, the app market server 30 is coupled to at least one image forming apparatus 10 through the network. The app market server 30 is a computer administering the app 140 which can be installed in the image forming apparatus 10. The service provided by the app market server 30 may be served as, for example, a cloud service.

For example, a view of the app 140 administered by the app market server 30 is displayed on the operation panel 15. The app 140 selected by the user from the view is downloaded into the image forming apparatus 10 so as to be installed. Within the second embodiment, the image forming apparatus 10 illustrated in FIG. 8 is substituted by the information processing terminal 20.

The above embodiments may be applied to an apparatus other than the image forming apparatus. This apparatus is such as a projector, an electronic whiteboard, a teleconference system, and a digital camera. The above embodiments may be applied to a general purpose computer such as a personal computer (PC).

Within the above embodiments, the image forming apparatus 10 and the information processing terminal 20 are an example of the information processing apparatus. The provisional installation flag is an example of the predetermined information.

It is possible to prevent a state where a program is not launched.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the information processing apparatus has been described in detail, it should be understood that various changes, substitutions, and alterations could be made thereto without departing from the spirit and scope of the invention.

The order of the method of the embodiment of the present invention is not limited to the order of processes of the method disclosed by this disclosure.

It should be noted that a person skilled in the field of information processing technology may employ the present invention using application specific integrated circuits (ASIC) or an apparatus in which circuit modules are connected.

Further, each of the functions (units) may be implemented by one or more circuits.

It should be noted that, in this specification, the circuit may include a processor programed by software to execute the corresponding functions and hardware which is designed to execute the corresponding functions such as the ASIC and the circuit module.

The present invention can be implemented in any convenient form, for example using dedicated hardware, or a mixture of dedicated hardware and software. The present invention may be implemented as computer software implemented by one or more networked processing apparatuses. The network can comprise any conventional terrestrial or wireless communications network, such as the Internet. The processing apparatuses can compromise any suitably programmed apparatuses such as a general purpose computer, personal digital assistant, mobile telephone (such as a WAP or 3G-compliant phone) and so on. Since the present invention can be implemented as software, each and every aspect of the present invention thus encompasses computer software implementable on a programmable device. The computer software can be provided to the programmable device using any storage medium for storing processor readable code such as a floppy disk, hard disk, CD ROM, magnetic tape device or solid state memory device.

The hardware platform includes any desired kind of hardware resources including, for example, a central processing unit (CPU), a random access memory (RAM), and a hard disk drive (HDD). The CPU may be implemented by any desired kind of any desired number of processor. The RAM may be implemented by any desired kind of volatile or non-volatile memory. The HDD may be implemented by any desired kind of non-volatile memory capable of storing a large amount of data. The hardware resources may additionally include an input device, an output device, or a network device, depending on the type of the apparatus. Alternatively, the HDD may be provided outside of the apparatus as long as the HDD is accessible. In this example, the CPU, such as a cache memory of the CPU, and the RAM may function as a physical memory or a primary memory of the apparatus, while the HDD may function as a secondary memory of the apparatus.

What is claimed is:

1. An information processing apparatus comprising:
a processor; and
a memory storing program instructions that cause the processor to
   execute an installation process including
      installing a program,
      validating provisional installation information for the program, the validated provisional installation information indicating that the program has not been executed after installation of the program,
      executing the program upon installation of the program, and
      invalidating the provisional installation information in a case where the execution of the program upon the installation of the program is successful, the invalidated provisional installation information indicating that a normal execution of the program has been checked upon installation; and
   execute a launch process of the program installed in the information processing apparatus upon starting up the information processing apparatus, the launch process including
      launching the program installed in the information processing apparatus; and
      determining whether the provisional installation information of the program is validated when the program is launched upon starting up the information processing apparatus wherein the program is not launched in a case where it is determined that the provisional installation information is validated.

2. The information processing apparatus according to claim 1, wherein the program instructions further cause the processor to
validate the provisional installation information in response to a predetermined input performed by a user for the successfully executed program.

3. The information processing apparatus according to claim 1, wherein the program instructions further cause the processor to
uninstall the program, for which the provisional installation information is validated.

4. The information processing apparatus according to claim 1, wherein the program instructions further cause the processor to
output an inquiry about the program, for which the provisional installation information is validated.

5. The information processing apparatus according to claim 1, wherein the provisional installation information is validated in a case where the program has not been executed after installation of the program.

6. The information processing apparatus according to claim 1, wherein, in a case where execution of the program after installation of the program is not successful
the provisional installation information is validated; and
the information processing apparatus is forcibly powered-off.

7. A method for processing information comprising:
installing a program;
validating a provisional installation information for the program, the validated provisional installation information indicating that the program has not been executed after installation of the program;
executing the program upon installation of the program;
invalidating the provisional installation information in a case where the execution of the program upon the installation of the program is successful, the invalidated provisional installation information indicating that a normal execution of the program has been checked after the installation has been checked upon installation;
launching the program installed in the information processing apparatus upon starting up the information processing apparatus; and
determining whether the provisional installation information of the program is validated when the program is launched upon starting up, wherein the program is not launched in a case where it is determined that the provisional installation information is validated.

8. The method for processing the information according to claim 7, wherein the provisional installation information is validated in in response to a predetermined input performed by a user for the successfully executed program.

9. The method for processing the information according to claim 7, wherein the program, for which the predetermined information is validated, is uninstalled.

10. The method for processing the, information according to claim 7 further comprising:
outputting an inquiry about the program for which the provisional installation information is validated.

11. The method for processing the information according to claim 7, wherein the provisional installation information is validated in a case where the program has not been executed after installation of the program.

12. The method for processing the information according to claim 7, wherein, in a case where execution of the program after installation of the program is not successful
the provisional installation information is validated; and
the information processing apparatus is forcibly powered-off.

13. A non-transitory computer readable storage medium including an information processing program causing an information processing apparatus to:
install a program;
validate a provisional installation information for the program, the validated provisional installation information indicating that the program has not been executed after installation of the program;
execute the program upon installation of the program;
invalidate the provisional installation information in a case where the execution of the program upon the installation is successful, the invalidated provision installation information indicating that a normal execution of the program has been checked upon installation;
launch the program installed in the information processing apparatus upon starting up the information processing apparatus, wherein the program is not launched in a. case where it is determined that the provisional installation information is validated.

14. The non-transitory computer readable storage medium according to claim 13, wherein the information processing program further causes the information, processing apparatus to:
validate the provisional installation information in response to a predetermined input performed by a user for the successfully executed program.

15. The non-transitory computer readable storage medium according to claim 13, wherein the information processing program fluffier causes the information processing apparatus to:
uninstall the program, for which the provisional installation information is validated.

16. The non-transitory computer readable storage medium according to claim 13, wherein the information processing program further causes the information processing apparatus to:
output an inquiry about the program, for which the provisional installation information is validated.

17. The non-transitory computer readable storage medium according to claim 13, wherein the provisional installation information is validated in a case where the program has not been executed after installation of the program.

18. The non-transitory computer readable storage medium according to claim 13, wherein, in a case where execution of the program after installation of the program is not successful
the provisional installation information is validated; and
the information processing apparatus is forcibly powered-off.

* * * * *